(12) United States Patent
Nasu

(10) Patent No.: US 6,411,550 B1
(45) Date of Patent: Jun. 25, 2002

(54) SEMICONDUCTOR INTEGRATED-CIRCUIT DEVICE

(75) Inventor: Hiroaki Nasu, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/628,757

(22) Filed: Jul. 31, 2000

(30) Foreign Application Priority Data

Aug. 2, 1999 (JP) .......................................... 11-218950

(51) Int. Cl.$^7$ ............................................. G11C 16/06
(52) U.S. Cl. .................. 365/185.21; 365/205; 365/207; 365/208; 327/51; 327/52; 327/54; 327/57
(58) Field of Search ........................... 365/185.21, 205, 365/207, 208; 327/51, 52, 54, 57

(56) References Cited

U.S. PATENT DOCUMENTS

| | | | | |
|---|---|---|---|---|
| 5,426,385 A | * | 6/1995 | Lai | ............................. 327/51 |
| 5,619,153 A | * | 4/1997 | Shenoy et al. | ............... 327/112 |
| 5,835,432 A | * | 11/1998 | Nakano | ....................... 365/205 |
| 5,929,660 A | * | 7/1999 | Dillinger | ...................... 327/51 |
| 6,195,297 B1 | * | 2/2001 | Sano | ....................... 365/189.11 |

* cited by examiner

Primary Examiner—Richard Elms
Assistant Examiner—Vanthu Nguyen
(74) Attorney, Agent, or Firm—Hogan & Hartson, L.L.P.

(57) ABSTRACT

To reduce current consumption in a sense amplifier circuit in a semiconductor integrated-circuit device, in particular, in a semiconductor integrated-circuit having a non-volatile memory as a memory element thereof. A Switching element for cutting off a direct current at the end of data reading from a memory is arranged in a path through which the direct current flows. In this way, the switching element cuts off the direct current at the moment of completion of the data reading from the memory, thereby substantially reducing current consumption.

20 Claims, 9 Drawing Sheets

SEMICONDUCTOR INTEGRATED-CIRCUIT DEVICE

BACKGROUND OF THE INVENTION

1. Field of the Invention

The present invention relates to a semiconductor integrated-circuit device including a sense amplifier formed on a semiconductor substrate.

2. Related Art

One known sense amplifier of a non-volatile memory such as a flash memory is a single-ended sense amplifier disclosed in Japanese Unexamined Patent Application Publication No. 8-63984.

In the conventional art, the above construction allows a direct current to flow between a memory cell transistor and a load transistor, thereby increasing a consumption current.

The present invention has been developed in view of the above problem, and one advantage of the present invention is to reduce the power consumption in a semiconductor integrated-circuit device having a sense amplifier

SUMMARY OF THE INVENTION

To solve the problem described above, a semiconductor integrated-circuit device in accordance with one embodiment of the present invention having a memory element and a sense amplifier circuit, includes an inverter amplifier including an inverter circuit and a first N-type, MOS transistor for receiving, at a gate thereof, an output signal from the inverter circuit, with a drain of the first N-type MOS transistor connected to an input of the inverter circuit, reference current generator means, a first P-type MOS transistor for receiving a signal from the reference current generator means, a second P-type MOS transistor which is connected in series with the first P-type MOS transistor and receives an output of the inverter amplifier at the input gate thereof, a third P-type MOS transistor connected in parallel with the first and second P-MOS transistors, and a second N-type MOS transistor for opening a current path to ground potential during a precharge operation.

In the above semiconductor integrated-circuit device, the memory element includes a non-volatile memory.

In the semiconductor integrated-circuit device a direct current required in a read operation from a memory element during precharging is cut off by the N-type MOS transistor, and a direct current during a read operation from a memory cell is cut off by the P-type MOS transistor. The direct current is cut off at the end of the read operation, and a duration of time during which the current flows remains constant. When an operation frequency drops, the direct current, which conventionally flows during an active period of the sense amplifier, is substantially reduced, thereby greatly lowering current consumption.

In accordance with a second embodiment of the present invention, a semiconductor integrated-circuit device having a memory element and a sense amplifier circuit includes reference current generator means, a first P-type MOS transistor for receiving a signal from the reference current generator means, a second P-type MOS transistor connected in series with the first P-type MOS transistor, a third P-type MOS transistor for precharging, connected in parallel with the first and second P-type MOS transistors, and an inverter circuit to which drains of the second and third P-type MOS transistors are connected, wherein an output of the inverter circuit is fed to a gate of the second P-type MOS transistor.

In the semiconductor integrated-circuit device, the memory element includes a non-volatile memory.

In the semiconductor integrated-circuit device a direct current in a read operation from a memory element is cut off by the P-type MOS transistor. The direct current is cut off at the end of the read operation, and a duration of time during which the current flows remains constant. When an operation frequency drops, the direct current, which conventionally flows during an active period of the sense amplifier, is substantially reduced, thereby greatly lowering current consumption.

In accordance with a third embodiment of the present invention, a semiconductor integrated-circuit device having a memory element and a sense amplifier circuit, includes an inverter amplifier including an inverter circuit and a first N-type MOS transistor for receiving, at a gate thereof, an output signal from the inverter circuit, with a drain of the first N-type MOS transistor connected to an input of the inverter circuit, a second N-type MOS transistor which is connected in series with a source of the first N-type MOS transistor with the source thereof connected to a ground line, and a first P-type MOS transistor for precharging, wherein the second N-type MOS transistor receives, at a gate thereof, a signal identical to a gate input signal to the first P-type MOS transistor.

In the semiconductor integrated-circuit device, the memory element includes a non-volatile memory.

In the semiconductor integrated-circuit device a direct current required in a read operation from a memory element during precharging is cut off by the N-type MOS transistor, and the current consumption is substantially reduced.

In accordance with a fourth embodiment of the present invention, a semiconductor integrated-circuit device of the present invention having a memory element and a sense amplifier circuit includes an inverter amplifier including an inverter circuit and a first N-type MOS transistor for receiving, at a gate thereof, an output signal from the inverter circuit, with a drain of the first N-type MOS transistor connected to an input of the inverter circuit, reference current generator means, a first P-type MOS transistor for receiving a signal from the reference current generator means, a second P-type MOS transistor for precharging, connected in parallel with the first P-type MOS transistor, and a second N-type MOS transistor connected in series with a source of the first N-type MOS transistor, wherein a source of the second N-type MOS transistor is connected to a ground line and the second N-type MOS transistor receives, at a gate thereof, a signal identical to a gate input signal to the second P-type MOS transistor.

In the semiconductor integrated-circuit device, the memory element includes a non-volatile memory.

In the semiconductor integrated-circuit device a direct current required in a read operation from a memory element during precharging is cut off by the N-type MOS transistor, and the current consumption is substantially reduced,

BRIEF DESCRIPTION OF THE DRAWINGS

Other features and advantages of the invention will be apparent from the following drawings that illustrate, by way of example, various features of embodiments of the present invention.

DETAILED DESCRIPTION

Figure 1:
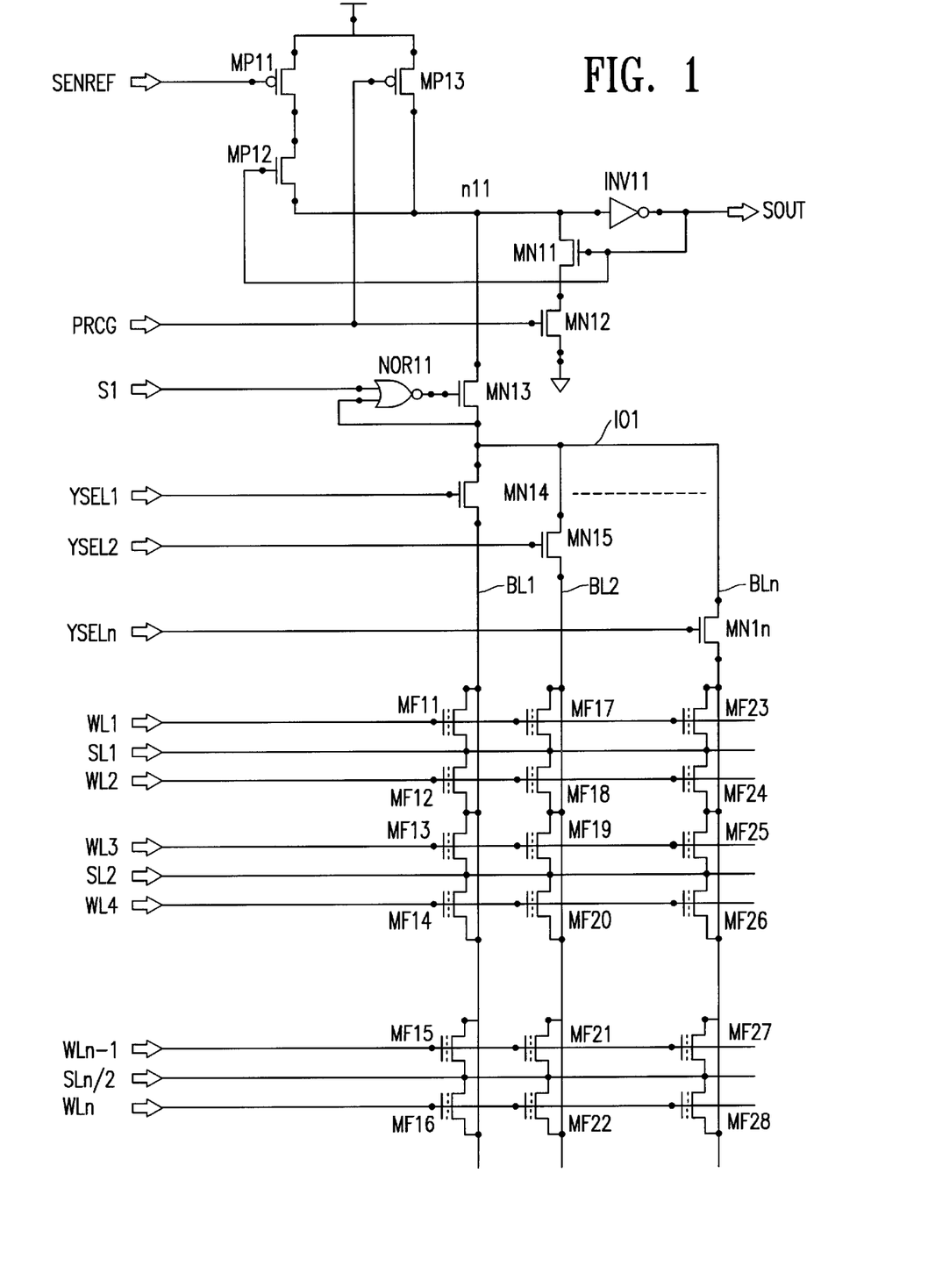
FIG. 1 is a circuit diagram of a sense amplifier of a semiconductor integrated-circuit device according to one embodiment of the present invention.

FIG. 1 is a circuit diagram showing a sense amplifier circuit in a semiconductor integrated-circuit device according to one embodiment of the present invention. The sense amplifier circuit includes a P-type MOS transistor MP11 which receives, at a gate thereof, an output signal SENREF of a reference current generator circuit with a source thereof connected to a power source, a P-type MOS transistor MP12 connected in series with the P-type MOS transistor MP11, a P-type MOS transistor MP13 which receives, at a gate thereof, a precharge signal PRCG, an inverter circuit INV11 with an input thereof connected to a node n11 of the P-type MOS transistor MP12 and the MP13, an N-type MOS transistor MN11 which receives, at the P-type MOS transistor gate thereof, an output SOUT of the inventor circuit INV11, and an N-type MOS transistor MN12 which opens a path to VSS during a precharge operation, and receives, at a gate thereof, the precharge signal PRCG with a source thereof connected to a ground line Vss.

The inverter circuit INV11 and the N-type MOS transistor MN11 constitute an inverter amplifier. When the precharge signal PRCG is transitioned to a low level, the P-type transistor MP13 turns on, and the N-type MOS transistor MN12 turns off, thereby causing the node n11 to rise to a VDD level.

The sense amplifier circuit and an IO node I01 are isolated from each other by an N-type MOS transistor MN13. The N-type MOS transistor MN13 prevents the voltages of the IO node and bit lines BL1, BL2, and BL3 from excessively rising during a precharge operation. The output of an NOR gate NOR11 is fed to the N-type MOS transistor MN13. The NOR gate NOR11 has input gates, one receiving an enable signal S1 (with the active-low level thereof) and the other connected to the IO node I01.

Non-volatile memory transistors MF1–MF16, MF17–MF22, and MF23–MF28 are respectively connected to bit lines BL1, BL2, and BL3. Connected to memory transistors are word line and a source line between every two word lines, across the bit lines. When an address signal is input, one word line designated by the address signal is selected from among word lines WL1 through WLn. Similarly, one is selected from bit line selection signals YSEL1 through YSELn, and one of the memory transistors MF1–MF28 is thus selected.

When the selected memory transistor is in an erased state, a current as high as 120 μA is permitted to flow from a drain-bit line to the ground line VSS with a power source voltage VDD of 5 V. In a programmed state, a current permitted to flow is almost zero with a power source voltage VDD of 5 V.

Figure 2:
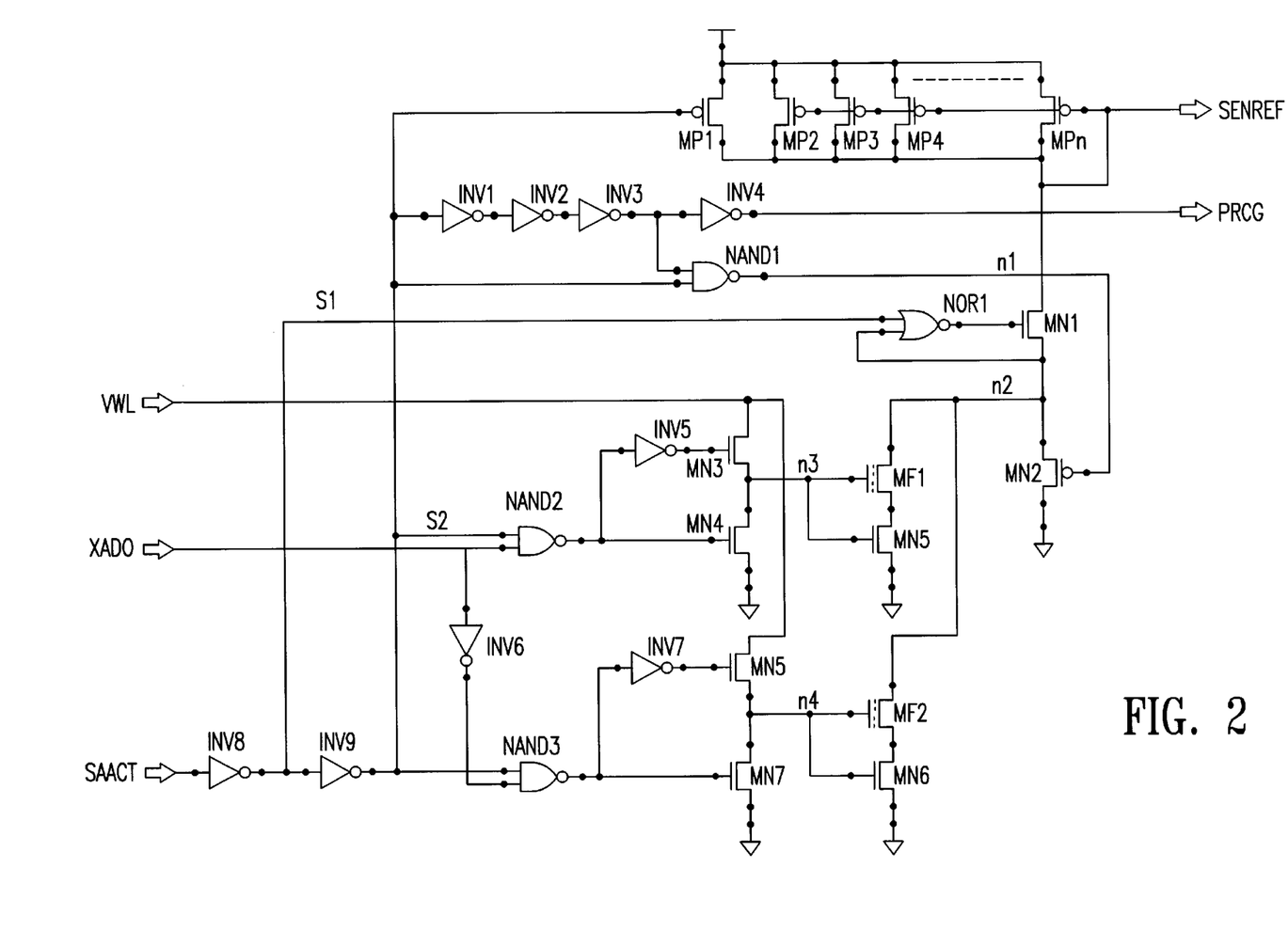
FIG. 2 is a circuit diagram of a reference current generator according to one embodiment of the present invention.

FIG. 2 is a circuit diagram showing a reference current generator circuit. A signal SAACT enables the sense amplifier and the reference current generator circuit, and is input to an inverter circuit INV8. An output signal S1 of the inverter circuit INV8 is input to an input of a NOR gate NOR1 while being input to the NOR gate NOR11 of the sense amplifier circuit. The S1 signal is also input to a delay circuit composed of inverter circuits INV9, INV1, INV2, INV3, and INV4, and then the inverter circuit INV4 gives the output thereof as the output signal PRCG, which is the precharge signal PRCG of the sense amplifier circuit.

An output signal S2 of the inverter circuit INV9 is input to the gate of a P-type MOS transistor MP1 for pulling up the SENREF signal. The output of the NOR gate NOR1 is fed to a gate of an N-type MOS transistor MN1. The N-type MOS transistor MN1 and the NOR gate NOR1 are included to form a circuit arrangement equivalent to that of the sense amplifier circuit, and no problem will be presented if the source and the drain of the MN1 are directly connected to each other.

A memory transistor MF1 and an N-type MOS transistor MN5, and a memory transistor MF2 and an N-type MOS transistor MN8 respectively constitute dummy memory cells, and an address signal XAD0 selects which of them to use. This selection is associated with the selection of the two word lines with the source line therebetween in the already-discussed sense amplifier circuit.

An n:1 current mirror circuit includes P-type MOS transistors MP2, MP3, MP4, and MPn, and the P-type MOS transistor MF11 in the sense amplifier circuit. A current permitted to flow into a node n11 of the sense amplifier circuit is a 1/n of the current flowing into the dummy memory cell circuit through the node SENREF of the reference voltage generator circuit and node n2.

Figure 3A:
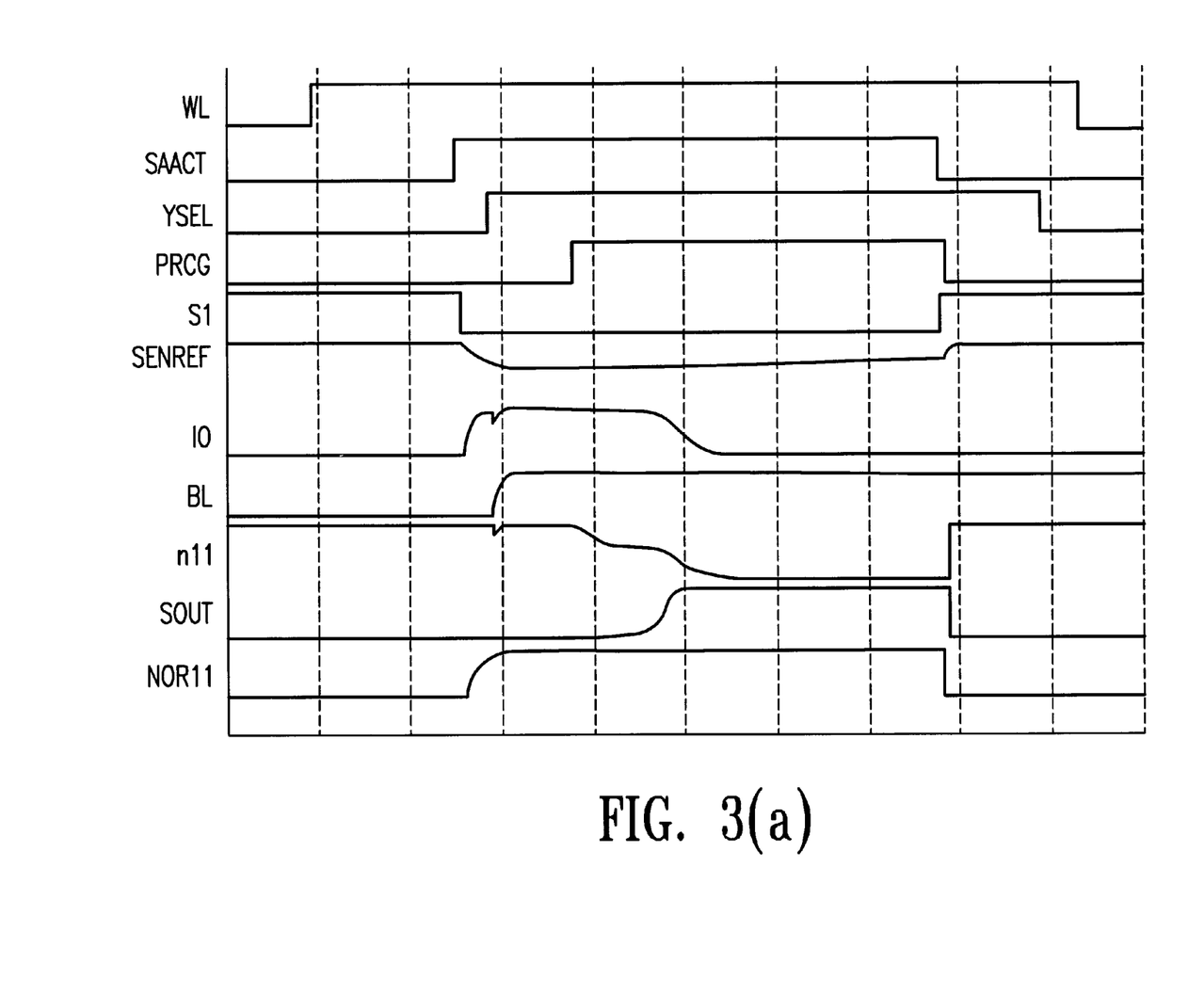
FIG. 3 is a timing diagram showing the operation of the sense amplifier of the semiconductor integrated-circuit device according to one embodiment of the present invention.
Figure 3B:
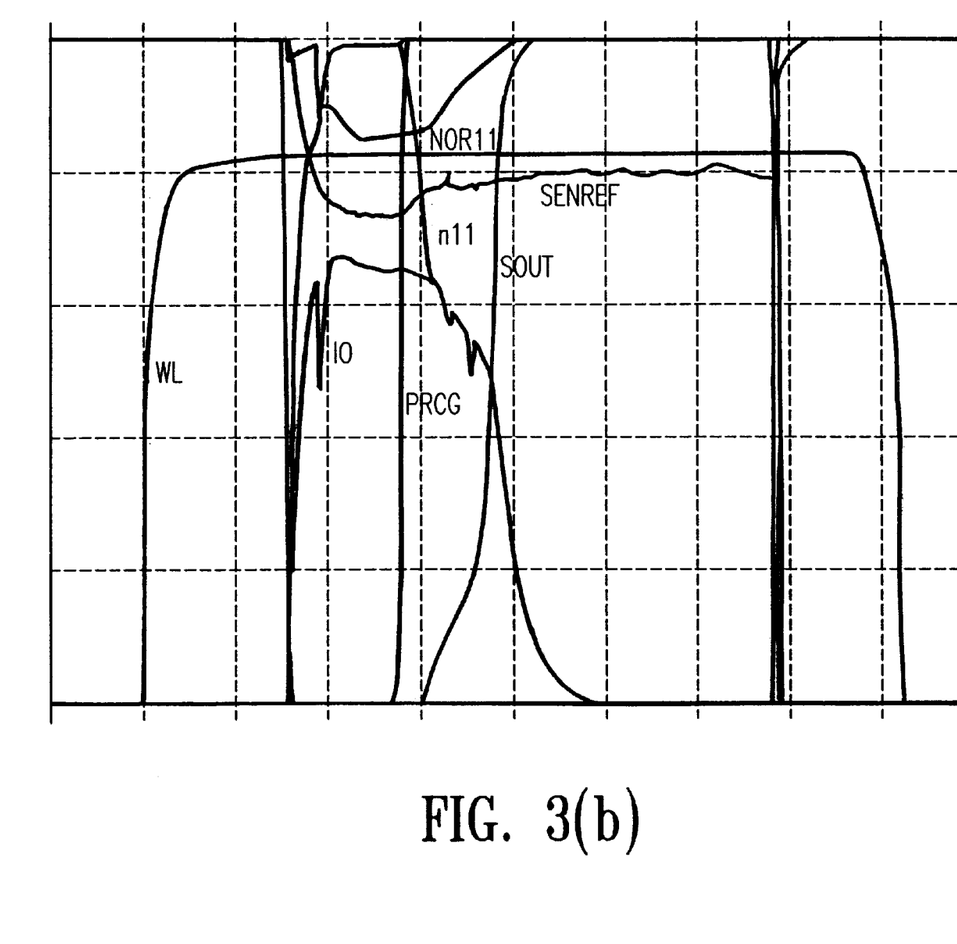

FIGS. 3(a) and 3(b) are timing diagrams showing the operation of the semiconductor integrated-circuit device according to one embodiment of the present invention when the memory transistor in the sense amplifier circuit is in an erased state. Designated S1 is an active-low signal, which is an inverted signal of the enable signal SAACT of the sense amplifier. Prior to activating the sense amplifier, one of the bit line selection signals YSEL1–YESLn and one of the word lines WL1–WLn are selected, thereby selecting one of the memory transistors MF1–MF28. The sense enable signal S1 is transitioned to a low level, the precharge signal PRCG is transitioned to a low level with a delay time that is determined by the delay circuit, and the nodes n11, and IO, and the bit line are precharged by the P-type MOS transistor MP13. With the precharge signal PRCG transitioned to a low level, the N-type MOS transistor MN12 turns off, blocking a precharge current from flowing into the inverter amplifier. Since the selected memory transistor discharges the charge for precharging in its erased state, the current drive capability of the P-type MOS transistor MP13 for precharging needs to be sufficiently greater than that of the memory transistor. In response to a rise in the voltage of the IO node I01, the output voltage of the NOR gate NOR11 drops, and the drive capability of the N-type MOS transistor MN13 also drops along therewith, and the precharging to the bit line thus ends. Since the precharging is performed during the low period of the signal PRCG, the node n11 rises in voltage above that of the IO node I01 and the bit line, and nearly reaches the VDD level.

When the precharging ends with the precharge signal PRCG transitioned to a high level, the charge stored in the bit line flows to the ground line VSS in the erased state of the selected memory transistor, thereby lowering the voltage of the bit line. The output of the NOR gate NOR11 rises to the VDD level, the drive capability of the N-type MOS transistor MN13 increases, and the voltage at the node n11 is lowered. With the voltage at the node n11 lowered, the voltage of the output SOUT of the inverter circuit INV11 rises, the current drive capability of the N-type MOS transistor MN11 increases, the nodes n11 and IO and the bit line are more rapidly lowered in voltage to the VSS level, because the charge at the IO node I01 and the bit line is discharged along with the memory transistor. Since the current flowing through the memory transistor and the serially connected transistors of the P-type MOS transistor MP11 and the P-type MOS transistor MP12, is allowed to be larger than the current passing through the serially connected transistors of the P-type MOS transistor MP11 and the P-type MOS transistor MP12 and determined by the reference signal SENREF, the nodes n11 and IO and the bit line drop in voltage to the VSS level. When the voltage of the node n11 drops, the voltage of the output SOUT of the inverter circuit INV11 rises, reaches the VDD level, and is read as a high level. With the SOUT at a high level, the P-type MOS transistor MP12 turns off, and the current flowing into the memory transistor is cut off. Therefore, at the moment the output data of the sense amplifier is determined, the P-type MOS transistor MP12 turns off, and the direct current is automatically cut off. The enable signal SAACT of the sense amplifier remains active.

Figure 4A:
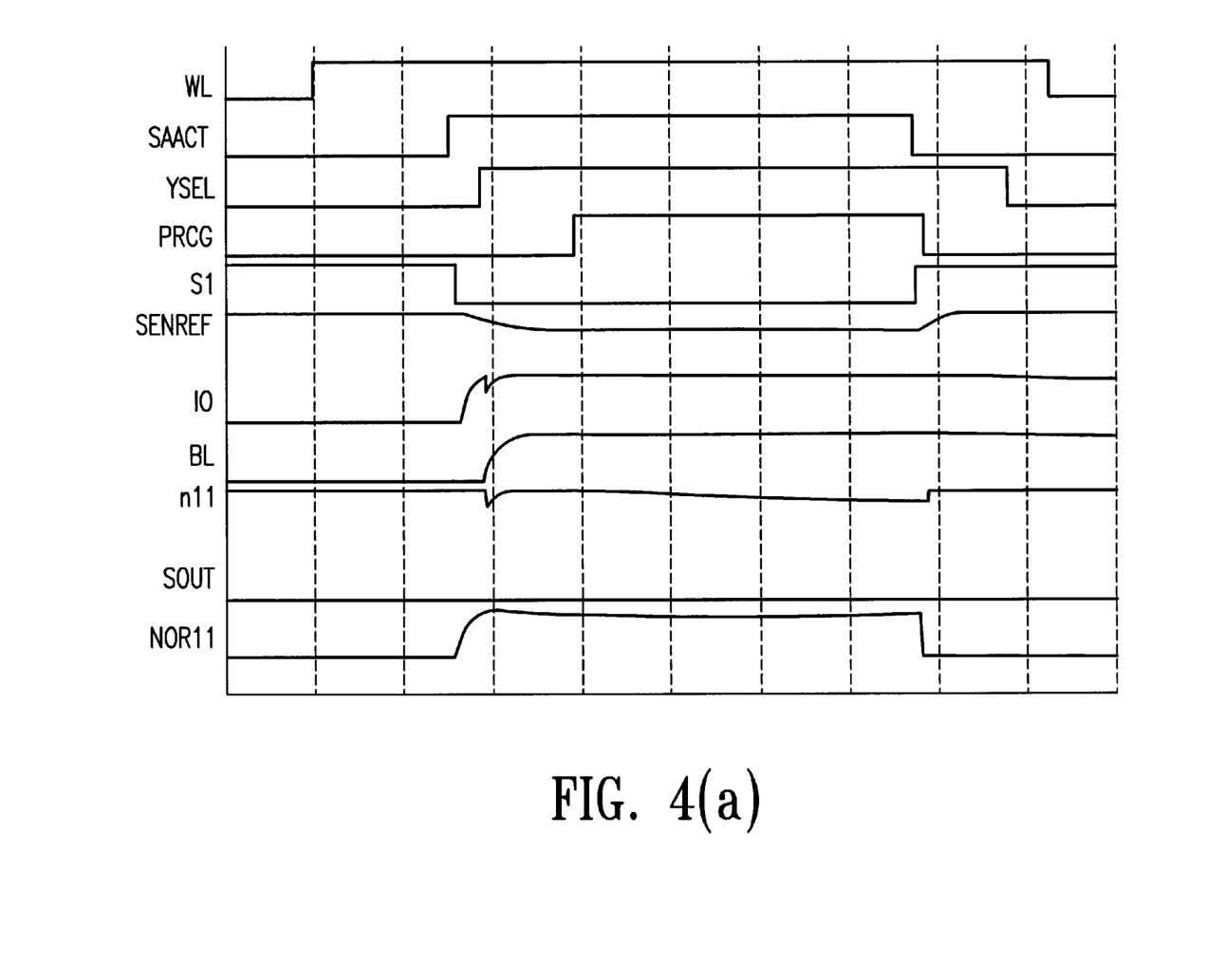
FIG. 4 is a timing diagram showing the operation of the sense amplifier of the semiconductor integrated-circuit device according to one embodiment of the present invention.
Figure 4B:
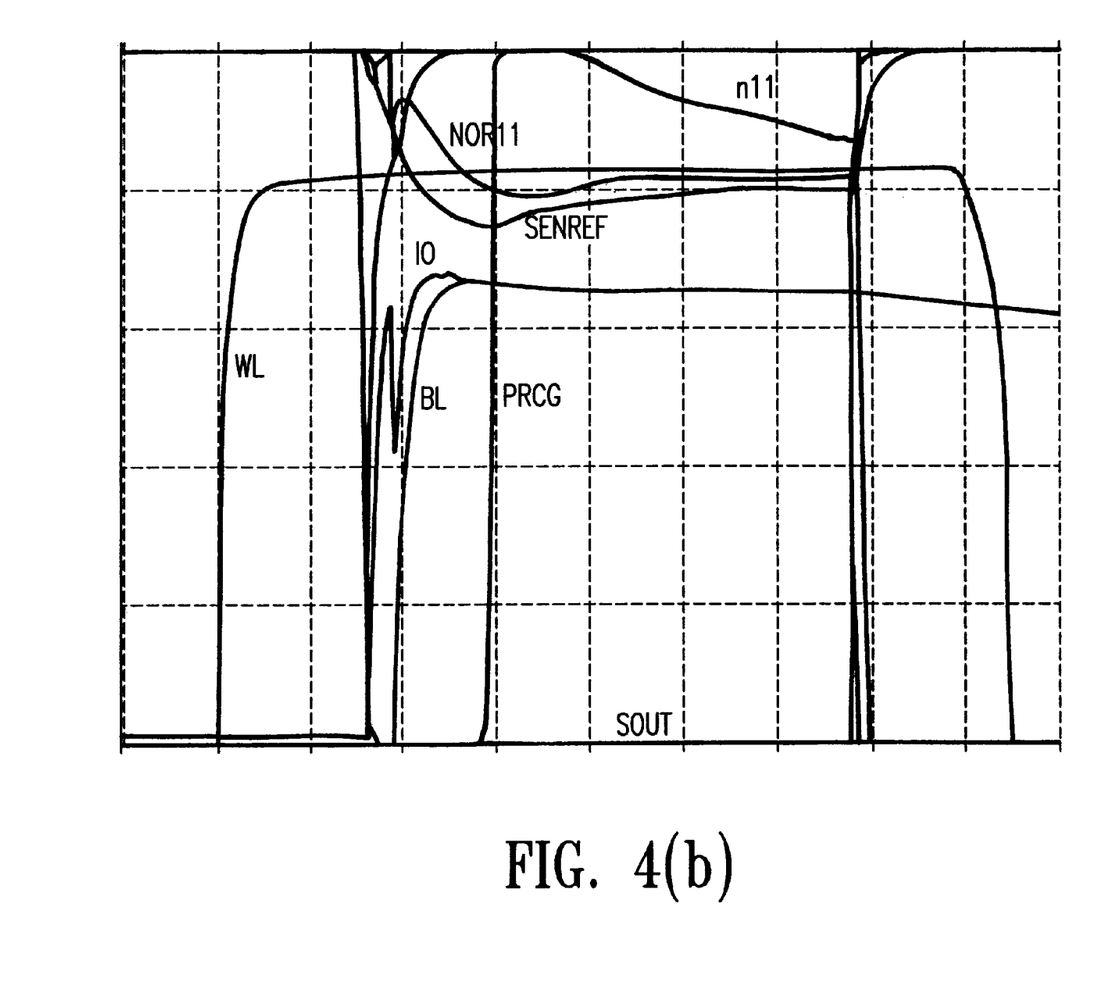

FIGS. 4(a) and 4(b) are timing diagrams showing the operation of semiconductor integrated-circuit device according to one embodiment of the present intention when the memory transistor in the sense amplifier is in a programmed state. In the same manner as in the erased state, one of the bit line selection signals YSEL1–YSELn and one of the word lines WL1–WLn are activated, thereby selecting one of the memory transistors MF1–MF28. The sense enable signal S1 is transitioned to a low level, the precharge signal PRCG is transitioned to a low level with a delay time that is determined by the delay circuit, and the nodes n11 and IO, and the bit line are precharged by the P-type MOS transistor MP13. With the precharge signal PRCG transitioned to a low level, the N-type MOS transistor MN12 turns off, blocking a precharge current from flowing into the inverter amplifier. With the selected memory transistor in the programmed state thereof, the charge stored therein is not discharged. The output voltage at the NOR gate NOR11 remains lowered, and the current drive capability of the N-type MOS transistor MN13 remains low. The node n11 is maintained at a high level, the output SOUT of the inverter circuit INV11 is kept to the VSS level, the N-type MOS transistor MN11 turns off, and direct current flows to nowhere.

Figure 5:
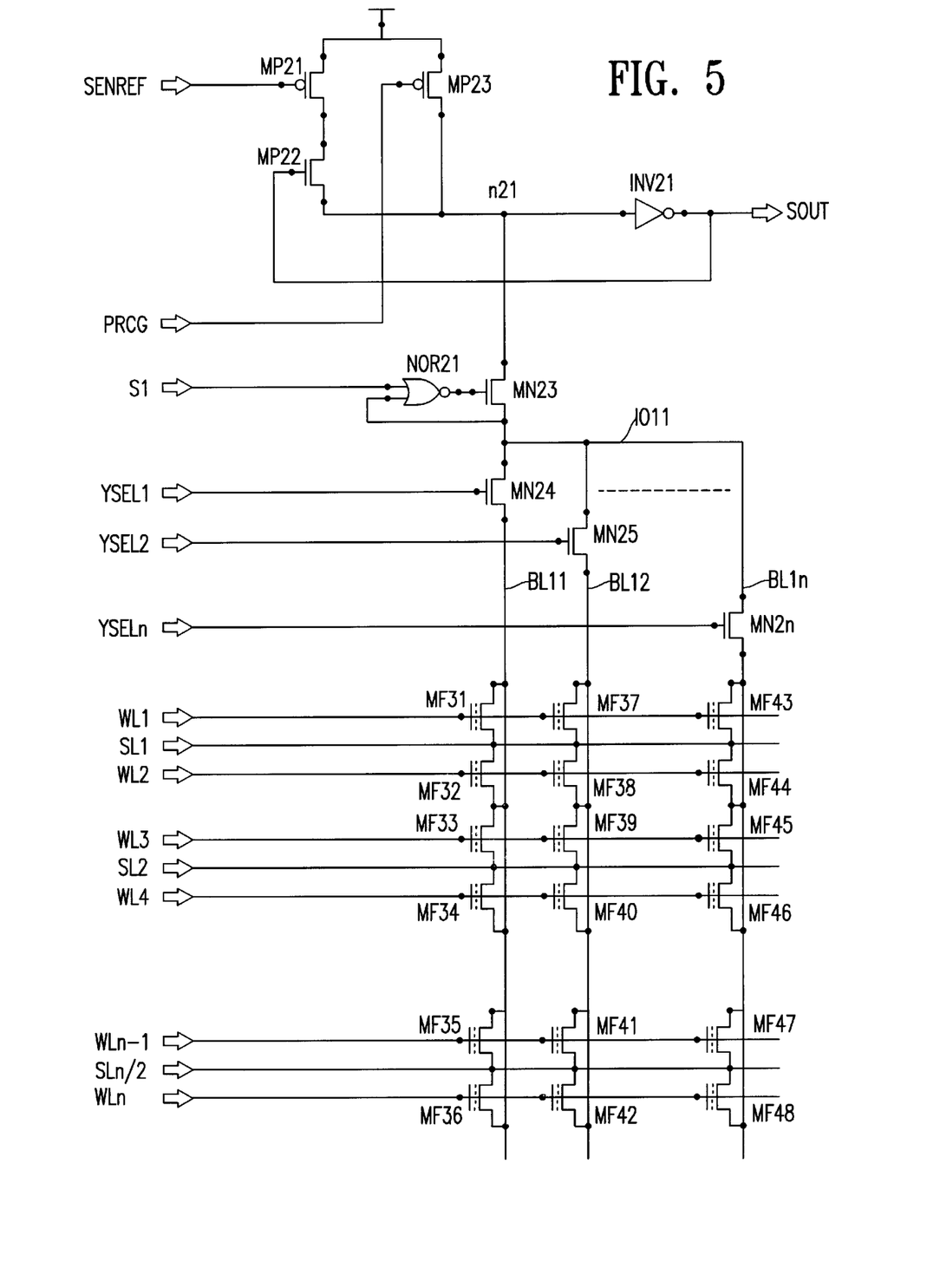
FIG. 5 is a current diagram showing a sense amplifier circuit of the semiconductor integrated-circuit device according to one embodiment of the present invention.

FIG. 5 is a circuit diagram of a second embodiment of the sense amplifier of the semiconductor integrated-circuit device of the present invention. The sense amplifier circuit includes a P-type MOS transistor MP21 which receives, at a gate thereof, an output signal SENREF of a reference current generator circuit with a source thereof connected to a power source, a P-type MOS transistor MP22 connected in series with the MP21, a P-type MOS transistor MP23 which receives, at a gate thereof, a precharge signal PRCG, and an inverter circuit INV21 with an input thereof connected to a node n21 of the P-type MOS transistor MP22 and the P-type MOS transistor MP23. The output SOUT of the inverter circuit INV21 is connected to the gate of the P-type MOS transistor MP22. The IO node and the bit line remain unchanged in construction from those shown in FIG. 1.

Designated S1 is an active-low signal, which is an inverted signal of the enable signal SAACT of the sense amplifier. Prior to activating the sense amplifier, one of the bit line selection signals YSEL1–YSELn and one of the word lines WL1–WLn are selected, thereby selecting one of the memory transistors MF31–MF48. The sense enable signal S1 is transitioned to a low level, the precharge signal PRCG is transitioned to a low level with a delay time that is determined by the delay circuit, and the nodes n21 and I011, and the bit line are precharged by the P-type MOS transistor MP23. Since the precharged charge is discharged with the selected memory transistor in an erased state, the current drive capability of the P-type MOS transistor MP23 for precharging needs to be set greater than that of the memory transistor. In response to a rise in the voltage of the IO node IO11, the output voltage of the NOR gate NOR21 drops, and the drive capability of the N-type MOS transistor MN23 also drops along therewith, and the precharging to the bit line thus ends. Since the precharging is performed during the low period of the signal PRCG, the node n21 rises in voltage above that of the IO node IO11 and the bit line, and nearly reaches the VDD level.

When the precharging ends with the precharge signal PRCG transitioned to a high level, the charge stored in the bit line flows to the ground line VSS in the erased state of the selected memory transistor, thereby lowering the voltage of the bit line. The output of the NOR gate NOR21 rises to the VDD level, the drive capability of the N-type MOS transistor MN23 increases, and the voltage at the node n21 is lowered. Since the memory transistor permits to flow a current larger than the current passing through the serially connected transistors of the P-type MOS transistor MP21 and the P-type MOS transistor MP22 and determined by the reference signal SENREF, the nodes n21 and IO and the bit line drop in voltage to the VSS level. With the voltage at the node n21 lowered, the voltage of the output SOUT of the inverter circuit INV21 rises, reaches the VDD level, and is read as a high level. With the SOUT at a high level, the P-type MOS transistor MP22 turns off, and the current flowing into the memory transistor is cut off. Therefore, at the moment the output data of the sense amplifier is determined, the P-type MOS transistor MP22 turns off, and the direct current is automatically cut off. The enable signal SAACT of the sense amplifier remains active.

In the same manner as in the erased state, one of the bit line selection signals YSEL1–YSELn and one of the word lines WL1–WLn are activated, thereby selecting one of the memory transistors MP31–MF48 with the selected memory transistor in a programmed state. The sense enable signal S1 is transitioned to a low level, the precharge signal PRCG is transitioned to a low level with a delay time that is determined by the delay circuit, and the nodes n21 and IO11, and the bit line are precharged by the P-type MOS transistor MP23. With the selected memory transistor in the programmed state thereof, the charge stored in the bit line is not discharged. The output voltage at the NOR gate NOR21 remains lowered, and the current drive capability of the N-type MOS transistor MN23 remains low. The node n21 is maintained at a high level, and the output SOUT of the inverter circuit INV21 is kept to the VSS level.

Figure 6:
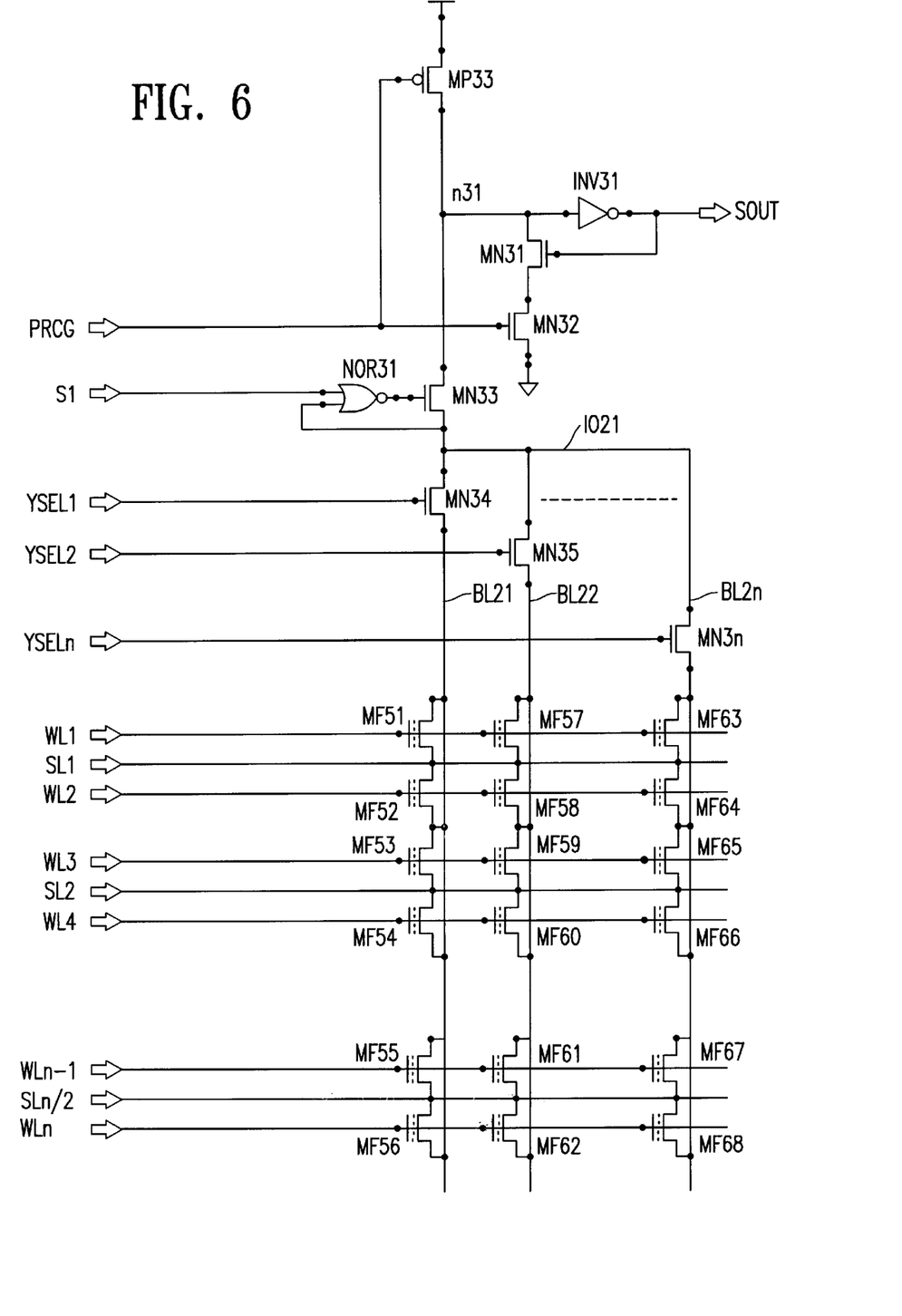
FIG. 6 is a circuit diagram showing a sense amplifier circuit of the semiconductor integrated-circuit device according to one embodiment of the present invention.

FIG. 6 is a circuit diagram of a third embodiment of the sense amplifier of the semiconductor integrated-circuit device of the present invention. The sense amplifier circuit includes a P-type MOS transistor MP33 which receives, at a gate thereof, a precharge signal PRCG, an inverter circuit INV31 with an input thereof connected to a node n31 to which the MP33 is connected, an N-type MOS transistor MN31 which receives, at a gate thereof, an output SOUT of the INV31, and an N-type MOS transistor MN32 which opens a path to VSS during a precharge operation, and receives, at a gate thereof, the precharge signal PRCG with a source thereof connected to a ground line Vss. The inverter circuit INV31 and the N-type MOS transistor MN31 constitute an inverter amplifier. The IO node and bit line remain unchanged in construction from those shown in FIG. 1.

Designated S1 is an active-low signal, which is an inverted signal of the enable signal SAACT of the sense amplifier. Prior to activating the sense amplifier, one of the bit line selection signals YSEL1–YSELn and one of the word lines WL1–WLn are selected, thereby selecting one of the memory transistors MF51–MF68. The sense enable signal S1 is transitioned to a low level, the precharge signal PRCG is transitioned to a low level with a delay time that is determined by the delay circuit, and the nodes n31, and IO21, and the bit line are precharged by the P-type MOS transistor MP33. Since the selected memory transistor discharges the charge for precharging in its erased state, the current drive capability of the P-type MOS transistor MP33 for precharging needs to be sufficiently greater than that of the memory transistor. In response to a rise in the voltage of the IO node IO21, the output voltage of the NOR gate NOR31 drops, and the drive capability of the N-type MOS transistor MN33 also drops along therewith, and the precharging to the bit line thus ends. Since the precharging is performed during the low period of the signal PRCG, the node n31 rises in voltage above that of the IO node IO21 and the bit line, and nearly reaches the VDD level.

When the precharging ends with the precharge signal PRCG transitioned to a high level, the charge stored in the bit line flows to the ground line VSS in the erased state of the selected memory transistor, thereby lowering the voltage of the bit line. The output of the NOR gate NOR31 rises to the VDD level, the drive capability of the N-type MOS transistor MN33 increases, and the voltage at the node n31 is lowered. With the voltage at the node n31 lowered, the voltage of the output SOUT of the inverter circuit INV31 rises, the current drive capability of the N-type MOS transistor MN31 increases, the nodes n31 and IO and the bit line are more rapidly lowered in voltage to the VSS level, because the charge at the IO node IO21 and the bit line is discharged along with the memory transistor. When the voltage of the node n31 drops, the voltage of the output SOUT of the inverter circuit INV31 rises, reaches the VDD level, and is read as a high level.

In the same manner as in the erased state, one of the bit line selection signals YSEL1–YSELn and one of the word lines WL1–WLn are activated, thereby selecting one of the memory transistors MF51–MF68 with the selected memory transistor in a programmed state. The sense enable signal S1 is transitioned to a low level, the precharge signal PRCG is transitioned to a low level with a delay time that is determined by the delay circuit, and the nodes n31 and IO21, and the bit line are precharged by the P-type MOS transistor MP33. With the selected memory transistor in its programmed state, the charge stored in the bit line is not discharged. The output voltage at the NOR gate NOR31 remains lowered, and the current drive capability of the N-type MOS transistor MN33 remains low. The node n31 is maintained at a high level, and the output SOUT of the inverter circuit INV31 is kept to the VSS level.

Figure 7:
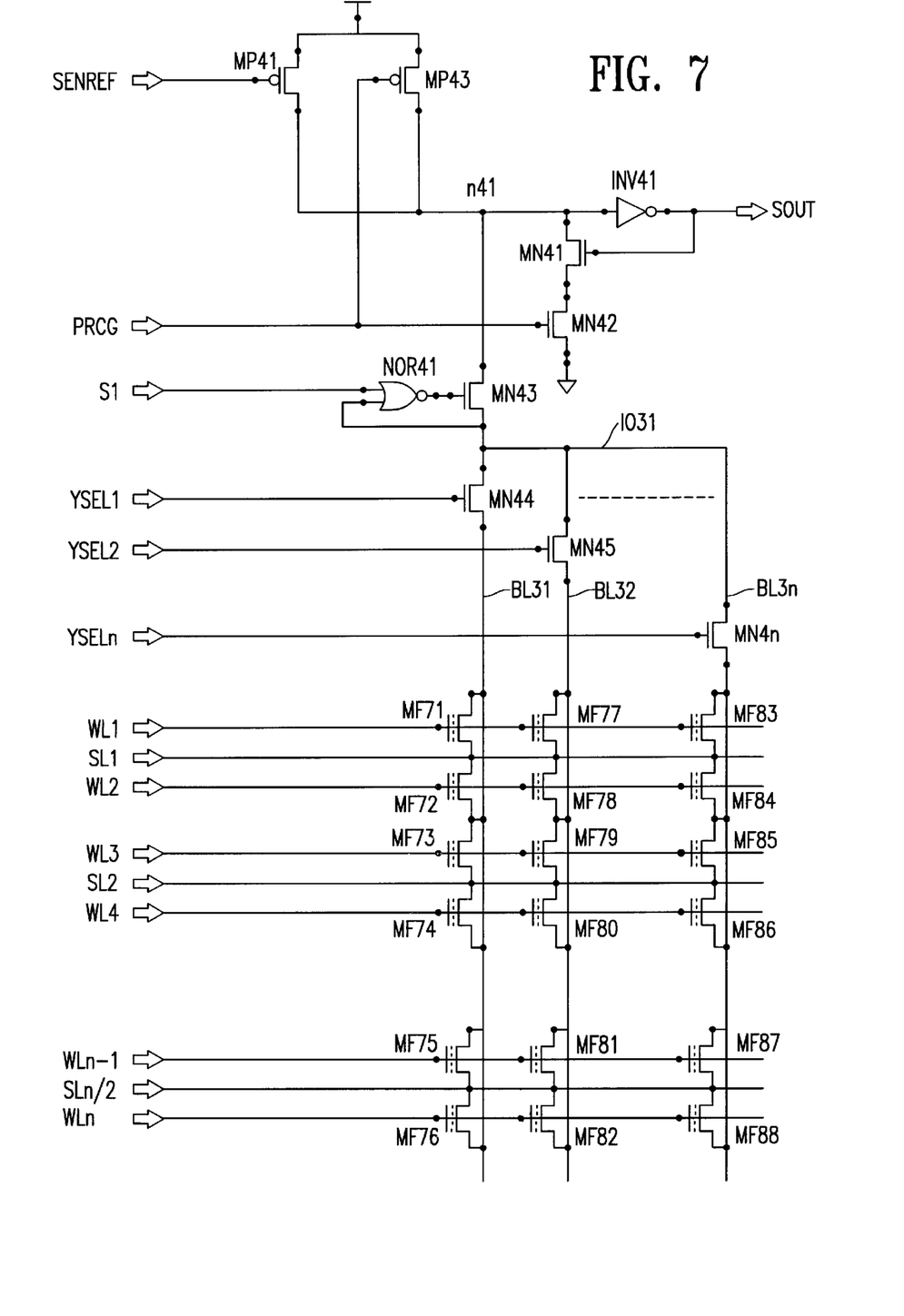
FIG. 7 is a circuit diagram showing a sense amplifier circuit of the semiconductor integrated-circuit device according to one embodiment of the present invention.

FIG. 7 is a circuit diagram showing a fourth embodiment of the sense amplifier circuit in the semiconductor integrated-circuit device of this invention. The sense amplifier circuit includes a P-type MOS transistor MP41 which receives, at a gate thereof, an output signal SENREF of a reference current generator circuit with a source thereof connected to a power source, a P-type MOS transistor MP43 which receives, at a gate thereof, a precharge signal PRCG, an inverter circuit INV41 with an input thereof connected to a node n41 of the P-type MOS transistor MP41 and the P-type MOS transistor MP43, an N-type MOS transistor MN41 which receives, at a gate thereof, an output SOUT of the inverter circuit INV41, and an N-type MOS transistor MN42 which opens a path to VSS during a precharge operation, and receives, at a gate thereof, the precharge signal PRCG with a source thereof connected to a ground line Vss.

Designated S1 is an active-low signal, which is an inverted signal of the enable signal SAACT of the sense amplifier. Prior to activating the sense amplifier, one of the bit line selection signals YSEL1–YSELn and one of the word lines WL1–WLn are selected, thereby selecting one of the memory transistors MF71–MF88. The sense enable signal S1 is transitioned to a low level, the precharge signal PRCG is transitioned to a low level with a delay time that is determined by the delay circuit, and the nodes n41, IO31, and the bit line are precharged by the P-type MOS transistor MP43. Since the selected memory transistor discharges the charge for precharging in its erased state, the current drive capability of the P-type MOS transistor MP43 for precharging needs to be sufficiently greater than that of the memory transistor. In response to a rise in the voltage of the IO node IO31, the output voltage of the NOR gate NOR41 drops, and the drive capability of the N-type MOS transistor MN43 also drops along therewith, and the precharging to the bit line thus ends. Since the precharging is performed during the low period of the signal PRCG, the node n41 rises in voltage above that of the IO node IO31 and the bit line, and nearly reaches the VDD level.

When the precharging ends with the precharge signal PRCG transitioned to a high level, the charge stored in the bit line flows to the ground line VSS in the erased state of the selected memory transistor, thereby lowering the voltage of the bit line. The output of the NOR gate NOR41 rises to the VDD level, the drive capability of the N-type MOS transistor MN43 increases, and the voltage at the node n41 is lowered. Since the memory transistor allows to flow a current larger than the current passing through the P-type MOS transistor MP41 and determined by the reference signal SENREF, the nodes n41 and IO and the bit line drop in voltage to the VSS level. With the voltage at the node n41 lowered, the voltage of the output SOUT of the inverter circuit INV41 rises, the current drive capability of the N-type MOS transistor MN41 increases, and the nodes n41 and IO and the bit line are more rapidly lowered in voltage to the VSS level, because the charge at the IO node IO31 and the bit line is discharged along with the memory transistor. Since the memory transistor and the serially connected transistors of the P-type MOS transistor MP41 and the P-type MOS transistor MP42 permit to flow a current larger than the current passing through the serially connected transistors of the P-type MOS transistor MP41 and determined by the reference signal SENREF, the nodes n41 and IO and the bit line drop in voltage to the VSS level. When the voltage of the node n41 drops, the voltage of the output SOUT of the inverter circuit INV41 rises, reaches the VDD level, and is read as a high level.

In the same manner as in the erased state, one of the bit line selection signals YSEL1–YSELn and one of the word lines WL1–WLn are activated, thereby selecting one of the memory transistors MF71–MF88 with the selected memory transistor in the programmed state thereof. The sense enable signal S1 is transitioned to a low level, the precharge signal PRCG is transitioned to a low level with a delay time that is determined by the delay circuit, and the nodes n41 and IO31, and the bit line are precharged by the P-type MOS transistor MP43. With the selected memory transistor in the programmed state thereof, the charge stored in the bit line is not discharged. The output voltage at the NOR gate NOR41 remains lowered, and the current drive capability of the N-type MOS transistor MN43 remains low. The node n41 is maintained at a high level, and the output SOUT of the inverter circuit INV41 is kept to the VSS level.

What is claimed is:

1. A semiconductor integrated-circuit device having a memory element and a sense amplifier circuit, comprising:

an inverter amplifier comprising an inverter circuit and a first N-type MOS transistor for receiving, at a gate thereof, an output signal from the inverter circuit, wherein a drain of the first N-type MOS transistor is connected to an input of the inverter circuit;

reference current generator means;

a first P-type MOS transistor for receiving a signal from the reference current generator means and a second P-type MOS transistor which is connected in series with the first P-type MOS transistor and receives an output of the inverter amplifier at an input gate thereof;

a third P-type MOS transistor connected in parallel with the first and second P-MOS transistors; and a second N-type MOS transistor for opening a current path to ground potential during a precharge operation.

2. The semiconductor integrated-circuit device according to claim 1, wherein the memory element comprises a non-volatile memory.

3. The semiconductor integrated-circuit according to claim 1, wherein a direct current required in a read operation from the memory element during pre-charging is not cut off by the second N-type MOS transistor.

4. The semiconductor integrated-circuit according to claim 1, wherein a source of the reference current generator means is connected to a power source.

5. The semiconductor integrated-circuit according to claim 1, wherein a source of the reference current generator means is connected to a power source.

6. The semiconductor integrated-circuit according to claim 1, wherein a source of the reference current generator means is connected to a power source.

7. A semiconductor integrated-circuit device having a memory element and a sense amplifier circuit, comprising:

reference current generator means;

a first P-type MOS transistor for receiving a signal from the reference current generator means and a second P-type MOS transistor connected in series with the first P-type MOS transistor;

a third P-type MOS transistor for precharging, connected in parallel with the first and second P-type MOS transistors; and an inverter circuit to which drains of the second and third P-type MOS transistors are connected, wherein an output of the inverter circuit is fed to a gate of the second P-type MOS transistor.

8. The semiconductor integrated-circuit device according to claim 7, wherein the memory element comprises a non-volatile memory.

9. The semiconductor integrated-circuit according to claim 7, wherein a direct current required in a read operation from the memory element is cut off by the third P-type MOS transistor.

10. The semiconductor integrated-circuit according to claim 7, wherein a source of the reference current generator means is connected to a power source.

11. A semiconductor integrated-circuit device having a memory element and a sense amplifier circuit comprising:

an inverter amplifier comprising an inverter circuit and a first N-type MOS transistor for receiving, at a gate thereof, an inverted output signal from the inverter circuit, wherein a drain of the first N-type MOS transistor is connected to an input of the inverter circuit;

a second N-type MOS transistor which is connected in series with a source of the first N-type MOS transistor with a source thereof connected to a ground line; and a first P-type MOS transistor for precharging, wherein the second N-type MOS transistor receives, at a gate thereof, a signal identical to a gate input signal to the first P-type MOS transistor.

12. The semiconductor integrated-circuit device according to claim 11, wherein the memory element comprises a non-volatile memory.

13. The semiconductor integrated-circuit according to claim 11, wherein a direct current required in a read operation from the memory element during pre-charging is cut off by the second N-type MOS transistor.

14. A semiconductor integrated-circuit device having a memory element and a sense amplifier circuit, comprising:

an inverter amplifier comprising an inverter circuit and a first N-type MOS transistor for receiving, at a gate thereof, an output signal from the inverter circuit, wherein a drain of the first N-type MOS transistor is connected to an input of the inverter circuit;

reference current generator means;

a first P-type MOS transistor for receiving a signal from the reference current generator means and a second P-type MOS transistor for precharging, connected in parallel with the first P-type MOS transistor; and a second N-type MOS transistor connected in series with a source of the first N-type MOS transistor, wherein a source of the second N-type MOS transistor is connected to a ground line and the second N-type MOS transistor receives, at a gate thereof, a signal identical to a gate input signal to the second P-type MOS transistor.

15. The semiconductor integrated-circuit device according to claim 14, wherein the memory element comprises a non-volatile memory.

16. The semiconductor integrated-circuit according to claim 14, wherein a direct current required in a read operation from the memory element during precharging is cut off by the second N-type MOS transistor.

17. A semiconductor integrated-circuit device having a memory element and a sense amplifier circuit, comprising:

an inverter amplifier comprising an inverter circuit and a first N-type MOS transistor for receiving, at a gate thereof, an output signal from the inverter circuit, wherein a drain of the first N-type MOS transistor is connected to an input of the inverter circuit;

a reference current generator circuit;

a first P-type MOS transistor for receiving a signal from the reference current generator circuit and a second P-type MOS transistor which is connected in series with the first P-type MOS transistor and receives an output of the inverter amplifier at an input gate thereof;

a third P-type MOS transistor connected in parallel with the first and second P-type MOS transistors; and a second N-type MOS transistor for opening a current path to ground potential during a pre-charge operation.

18. A semiconductor integrated-circuit device having a memory element and a sense amplifier circuit comprising:

a reference current generator circuit;

a first P-type MOS transistor for receiving a signal from the reference current generator circuit and a second P-type MOS transistor connected in series with the first P-type MOS transistor;

a third P-type MOS transistor for pre-charging, connected in parallel with the first and second P-type MOS transistors; and an inverter circuit to which drains of the second and third P-type MOS transistors are connected, wherein and output of the inverter circuit is fed to a gate of the second P-type MOS transistor.

19. A semiconductor integrated-circuit device having a memory element and a sense amplifier comprising:

an inverter amplifier comprising an inverter circuit and a first N-type MOS transistor for receiving, at a gate thereof, an output signal from the inverter circuit, wherein a drain of the first N-type MOS transistor is connected to an input of the inverter circuit;

a reference current generator circuit;

a first P-type MOS transistor for receiving a signal from the reference current generator circuit and a second P-type MOS transistor for pre-charging, connected in parallel with the first P-type MOS transistor; and a second N-type MOS transistor which is connected in series with a source of the first N-type MOS transistor with a source thereof connected to a ground line;

wherein the second N-type MOS transistor receives, at a gate thereof, a signal identical to a gate input signal to the first P-type MOS transistor.

20. A semiconductor integrated-circuit device having a memory element and a sense amplifier circuit, comprising:

an inverter amplifier comprising an inverter circuit and a first N-type MOS transistor for receiving, at a gate thereof, an output signal from the inverter circuit, wherein a drain of the first N-type MOS transistor is connected to an input of the inverter circuit;

a reference current generator circuit;

a first P-type MOS transistor for receiving a signal from the reference current generator circuit and a second P-type MOS transistor for pre-charging, connected in parallel with the first P-type MOS transistor; and a second N-type MOS transistor connected in series with a source of the first N-type MOS transistor, wherein a source of the second N-type MOS transistor is connected to a ground line and the second N-type MOS transistor receives, at a gate thereof, a signal identical to a gate input signal to the second P-type MOS transistor.

* * * * *